United States Patent [19]

Oehler

[11] 4,179,626

[45] Dec. 18, 1979

[54] SENSE CIRCUIT FOR USE IN VARIABLE THRESHOLD TRANSISTOR MEMORY ARRAYS

[75] Inventor: Harry G. Oehler, Pasadena, Md.

[73] Assignee: Westinghouse Electric Corp., Pittsburgh, Pa.

[21] Appl. No.: 920,299

[22] Filed: Jun. 29, 1978

[51] Int. Cl.² .................... H03K 5/20; G11C 7/00; G11C 11/40; H03K 3/353
[52] U.S. Cl. .................................. 307/238; 307/355; 307/362; 307/DIG. 3; 365/184; 365/196; 365/207
[58] Field of Search ............... 307/238, 355, 362, 363, 307/DIG. 3; 365/184, 185, 196, 203, 207

[56] References Cited

U.S. PATENT DOCUMENTS

| | | | |
|---|---|---|---|
| 3,925,804 | 12/1975 | Cricchi | 307/DIG. 3 X |
| 4,054,864 | 10/1977 | Audaire et al. | 365/184 X |
| 4,090,257 | 5/1978 | Williams | 365/184 |
| 4,090,258 | 5/1978 | Cricchi | 365/184 |
| 4,090,259 | 5/1978 | Wilcock et al. | 365/184 X |
| 4,094,008 | 6/1978 | Lockwood et al. | 365/184 X |
| 4,096,401 | 6/1978 | Hollingsworth | 307/DIG. 3 X |
| 4,130,890 | 12/1978 | Adam | 307/238 X |
| 4,139,911 | 2/1979 | Sciulli et al. | 307/238 X |

Primary Examiner—Larry N. Anagnos
Attorney, Agent, or Firm—R. M. Trepp

[57] ABSTRACT

A memory sense circuit is described incorporating a number of field effect transistors for comparing the threshold voltage of two variable threshold transistors.

3 Claims, 4 Drawing Figures

SENSE CIRCUIT FOR USE IN VARIABLE THRESHOLD TRANSISTOR MEMORY ARRAYS

BACKGROUND OF THE INVENTION

1. Field of the Invention

This invention relates to semiconductor memory sense circuits particularly to variable threshold transistor memory sense circuits.

2. Description of the Prior Art

Various sense circuits have been described for use with variable threshold transistor memory arrays. One of the simplest sense circuits used in the past is an RS flip-flop. The RS flip-flop is first precharged and then released to select a logic state by the collector or drain which discharges first on one side to latch in one logic state rather than the other. One example of an RS flip-flop used in a non-volatile semiconnector memory is described in U.S. patent application Ser. No. 755,280, filed Dec. 29, 1976, now U.S. Pat. No. 4,090,258, entitled "Improved MNOS Non-Volatile Memory" to J. R. Cricchi and assigned to the assignee herein. In the Patent to Cricchi one side of the RS flip-flop was coupled to a variable threshold transistor of a memory cell written in one memory state while the other side of the flip-flop was coupled to a second variable threshold transistor of the same memory cell written in the opposite direction. A memory cell containing two variable threshold transistors written in the opposite direction relative to one another or detection.

RS flip-flops have also been utilized in memories for detecting the state of a variable threshold transistor where only one variable transistor is used per memory cell by comparing the characteristics of the variable threshold transistor with a second variable threshold transistor written to a predetermined state or a threshold voltage. A variable threshold transistor may also be compared with a known current source or voltage for determining its memory state or threshold voltage. The second transistor or current source or voltage source may have its own variations due to normal manufacturing processes which induce variations during the fabrication of the circuit. In addition, power supply variations may cause variations in the voltage source or current source which is used to be compared with the characteristics of the memory transistor.

The effect of various variations in voltages or currents is to reduce the threshold voltage window or conductance window that differentiates one binary state of a variable threshold transistor from the other. Sense circuits are then required to be more sensitive to narrower differences to detect one binary state from the other.

One approach for a more sensitive sense circuit has been to provide amplification prior to detection by the RS flip-flop or latch. One example of a sense circuit utilizing an amplifier followed by a latch was described by Lawrence G. Heller, D. P. Spampinato and Ying L. Yao in a publication entitled "High-Sensitivity Charge-Transfer Sense Amplifier" in the proceedings of the 1975 IEEE International Solid-State Circuits Conference Digest of Technical Papers, pages 112-113, Feb. 13, 1975. In the publication by Heller et al. the input signal is preamplified using a charge-transfer technique and then fed to an RS flip-flop cross-coupled pair of transistors, for further amplification and storage. The sense amplifier uses eight N-channel transistors exclusive of the memory cell and dummy cell.

It is therefore desirable to provide a novel sense circuit which utilizes a charge-transfer technique for sensitivity in detecting the memory state of a variable threshold transistor in a memory array.

It is further desirable to combine the function of a charge-transfer circuit with a logic circuit to provide a novel sense circuit.

It is desirable to integrate a charge-transfer circuit and a latch to form a novel sense circuit utilizing the minimum number of transistors.

SUMMARY OF THE INVENTION

In accordance with the present invention, a memory sense circuit is provided for comparing the threshold voltage of a first and second variable threshold transistor wherein the source electrode of the first and second variable threshold transistors are coupled to a first voltage supply and the gate electrodes are coupled to a first control signal comprising third through fifth field effect transistors each having a gate, source and drain electrode, the gate electrode of the third and fifth transistors coupled to a second power supply, the source electrode of the third transistor coupled to the drain electrode of the first variable threshold transistor, the source electrode of the fifth transistor coupled to the drain electrode of the second variable threshold transistor, the drain electrode of the third transistor coupled to the gate electrode of the fourth transistor, the drain electrode of the fifth transistor coupled to the source electrode of the fourth transistor, a second control signal, first means coupled to and responsive to the second control signal for coupling the drain electrode of the third and fourth transistors to a return path of the first voltage supply to precharge selected circuit nodes.

DESCRIPTION OF THE PREFERRED EMBODIMENTS

Figure 1:
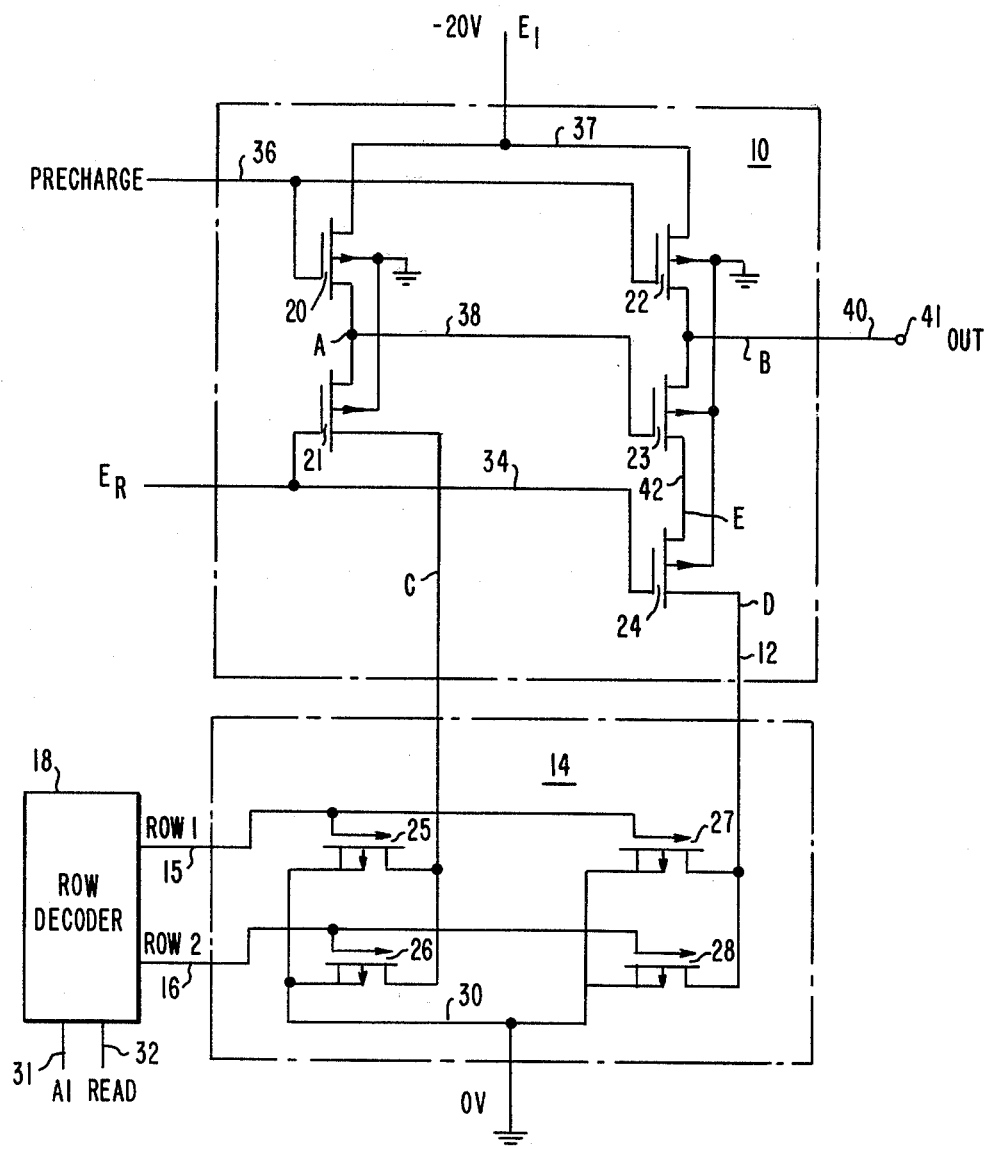
FIG. 1 is a circuit schematic of one embodiment of the invention.

Referring to FIG. 1, sense circuit 10 is coupled over lines 11 and 12 to memory array 14. Memory array 14 is coupled over lines 15 and 16 to row decoder 18. Row decoder 18 functions to select a row in memory array 14 for the readout of information. Memory sense circuit 10 functions to compare the threshold voltage of one memory cell or bit of a selected row in memory array 14 to a second voltage source which may be a memory cell variable threshold transistor written to a predetermined threshold voltage.

Memory sense circuit 10 comprises transistors 20 through 24 each having a gate, source and drain electrode. Transistors 20 through 24 may be, for example, P-channel transistors. The body of transistors 20 through 24 are coupled together to ground potential. Memory array 14 comprises transistors 25 through 28 each having a gate, source and drain electrode. The body of transistors 25 through 28 are coupled to its respective source electrode in the readout mode. Transistors 25 through 28 may be, for example, field effect transistors of a P-channel type. Transistors 25 and 26 are variable threshold transistors. The body and source electrode of transistors 25 through 28 are coupled over line 30 to voltage supply $E_1$ which may, for example, be at ground potential. The drain electrode of transistors 25 and 26 are coupled over line 11 to the source electrode of transistor 21. The drain electrode of transistors 27 and 28 are coupled over line 12 to the source electrode of transistor 24. The gate electrode of transistors 25 and 27 are coupled over line 15 to an output of row decoder 18. The gate electrode of transistors 26 and 28 are coupled over line 16 to an output of row decoder 18. Signal A1 is coupled over line 31 to an input of row decoder 18. Signal READ is coupled over line 32 to an input of row decoder 18. Row decoder 18 functions to select either line 15 or 16 in response to address signal A1 on line 31 at times when signal READ on line 32 is present.

The gate electrode of transistors 21 and 24 are coupled over line 34 to voltage supply $E_R$ which may be, for example, −7.5 volts. The gate electrode of transistors 20 and 22 are coupled over line 36 to control signal PRECHARGE. The drain electrode of transistors 20 and 22 are coupled over line 37 to their return path or negative side of voltage supply $E_1$ which may be, for example, −20 volts. The source electrode of transistor 20 is coupled over line 38 to the drain electrode of transistor 21 and the gate electrode of transistor 23. The source electrode of transistor 22 is coupled over line 40 to output terminal 41 and to the drain electrode of transistor 23. The source electrode of transistor 23 is coupled over line 42 to the drain electrode of transistor 24.

Transistors 20 and 22 provide a first means coupled to and responsive to control signal PRECHARGE for coupling the drain electrode of transistors 21 and 23 to a return path of voltage supply $E_1$ such as −20 volts to precharge the drain electrode of transistors 21 and 23 and the source electrode of transistor 23.

Figure 2:
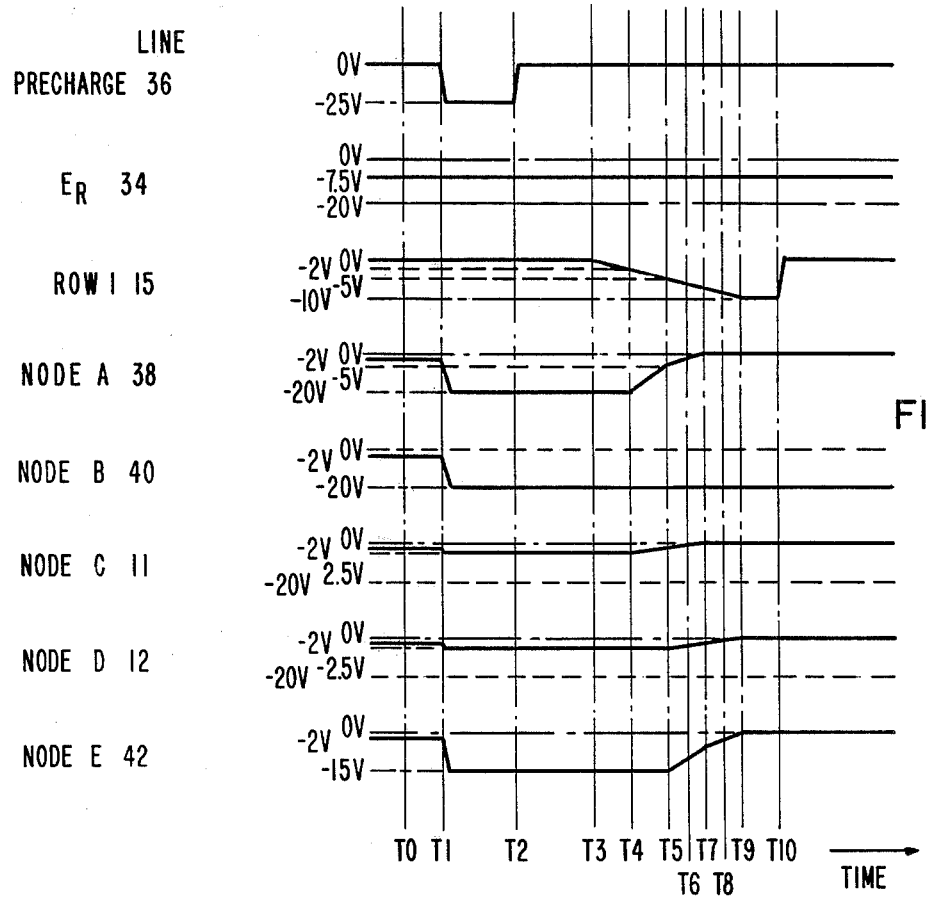
FIGS. 2 and 4 show circuit wave forms for the operation of the embodiment of the invention shown in FIG. 1.

The operation of the embodiment of the invention shown in FIG. 1 may be better understood by referring to FIG. 2 which shows circuit wave forms. In FIG. 2 the ordinate represents voltage and the abscissa represents time. As shown in FIG. 2 at time $T_0$ signal PRECHARGE on line 36 and line 15 and 16 from row decoder 18 are at 0 volts. Voltage supply $E_R$ is at a voltage equal to −1.5 ($V_T$) where $V_T$ is the source follower threshold of transistors 21 and 24. The typical source follower threshold of a P-channel transistor is about 5 volts. The voltage of voltage supply $E_R$ may be, for example, −7.5 volts. Voltage supply $E_R$ may be in the range of between one to two times the source follower threshold voltage of transistors 21 and 24. At time $T_0$ the voltage on circuit nodes A, B, C, D and E may be −2 volts or less depending upon the prior read operation from memory array 14. As shown in FIG. 2 the voltage of circuit nodes A through E are shown at −2 volts.

At time $T_1$ signal PRECHARGE on line 36 goes from 0 volts to −25 volts causing transistors 20 and 22 to conduct charging node A on line 38 and node B on line 40 to −20 volts. Since transistors 20 and 22 are in the source follower mode having a threshold voltage of 5 volts the source electrode voltage is 5 volts above the gate voltage or −20 volts. With −20 volts on node A or line 38 transistor 23 is caused to conduct precharging node E on line 42 to −15 volts. With the voltage on node A at −20 volts and the voltage on node E at −15 volts, nodes C and D are charged to a voltage of $E_R$-$V_T$ where $V_T$ equals −5 volts. Then $E_R$-$V_T$ equals −2.5 volts.

At time $T_2$ signal PRECHARGE goes from −25 volts to 0 volts causing transistors 20 and 22 to be nonconducting and allowing circuit nodes A through E to float.

For proper operation of sense circuit 10, it is understood that node C has a capacitance of approximately one hundred times that of node A. Normally node C has a large capacitance due to the fact that the drain electrodes of the transistors in a column in memory array 14 will contribute a large capacitance to node C.

For purposes of example, transistor 25 has a threshold voltage of −2 volts and transistor 27 which is a sense or reference transistor has a threshold voltage of −5 volts. A threshold voltage of −5 volts is in between the high threshold voltage of −8 volts and the low threshold voltage of −2 volts of the variable threshold transistors in the array. Transistor 28 also functions as a reference or sense transistor to provide a voltage for comparing the output of transistor 26 with itself for determining the state of transistor 26.

At time $T_3$ row decoder 18 in response to signals A1 and READ selects row 1 or line 15 which goes from 0 volts towards −10 volts. At time $T_4$ the voltage on line 15 has dropped to −2 volts, the threshold voltage of transistor 25, and transistor 25 begins to conduct current. Transistor 25 discharges node C toward ground potential or the voltage of voltage supply $E_1$. The increase in voltage of node C turns transistor 21 back on. Transistor 21 had previously charged node C in the source follower mode and had turned itself off when node C had reached $E_R$-$V_T$. Transistor 21 conducts, causing node A to rise in potential towards 0 volts as shown in FIG. 2. At time $T_5$ node A has reached −5 volts and transistor 23 is turned off or to the non-conducting state. With transistors 22 and 23 in a non-conducting state node B or line 40 is isolated and is floating at −20 volts.

At time $T_5$ line 15 has crossed −5 volts potential and transistor 27 begins to conduct current. With transistor 27 conducting current node D begins to charge from −2.5 volts up towards ground potential. The potential of voltage supply $E_1$. Transistor 24 begins to conduct charge causing node E to charge for −15 volts towards 0 volts. At time $T_6$ node A has reached ($E_R$-$V_T$) volts, −2.5 v., for example, due to the conduction of transistor 21. At time $T_7$ node C has reached 0 volts due to the conduction of transistor 25. At time $T_8$ node E has reached ($E_R$-$V_T$) volts, −2.5 v., for example, due to the conduction of transistor 24. At time $T_9$ node D has reached 0 volts due to the conduction of transistor 27. Also at time $T_9$ line 15 has reached −10 volts. At time $T_{10}$ line 15 goes from −10 volts to 0 volts. The READ cycle is now complete for the case where transistor 25 has a threshold voltage of −2 volts and the output on line 40, node B, is −20 volts.

Figure 3:
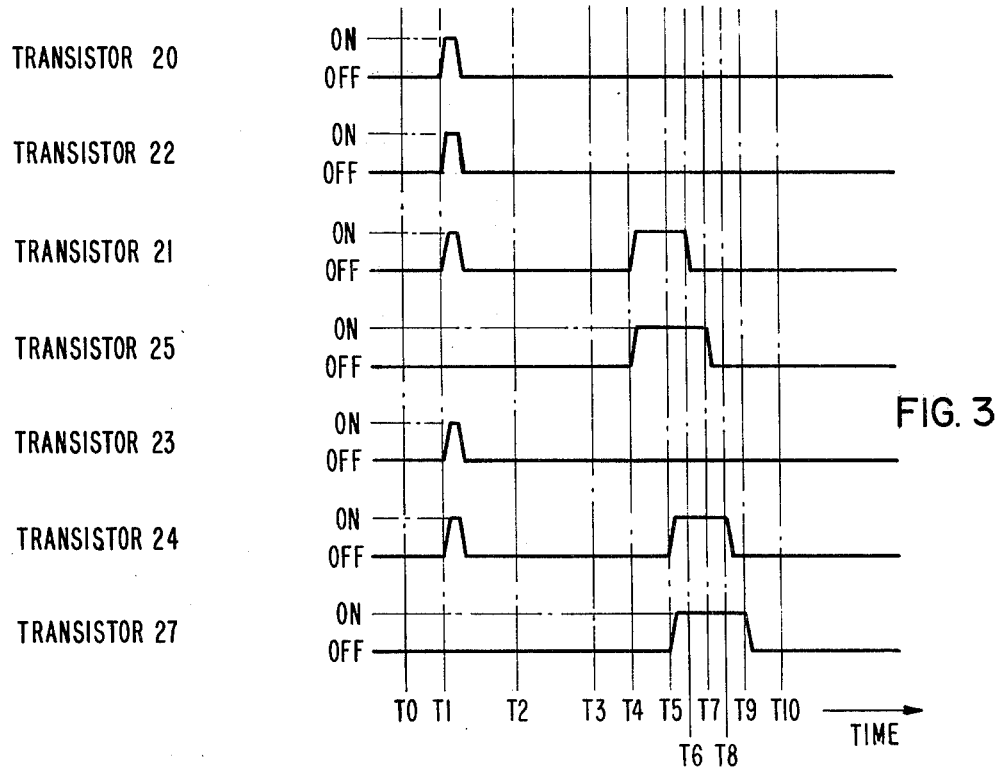
FIG. 3 shows wave forms of the conduction of selected transistors for the operation of the embodiment of the invention shown in FIG. 1.

FIG. 3 shows wave forms of the conduction of transistors 20 through 25 and 27 when charge is being passed through the transistors in normal circuit operation when the voltages are as shown in FIG. 2. Referring to FIGS. 2 and 3 transistors 20 and 22 conduct charge to precharge nodes A and B after $T_1$. Transistors 21, 23 and 24 conduct charge to precharge nodes C, E and D after time $T_1$. At time $T_4$ transistors 21 and 25 conduct charge which results in the charging of nodes A and C. At time $T_5$ transistors 24 and 27 conduct charge which results in the charging of nodes E and D. Transistor 23 does not conduct charge after the initial precharge at time $T_1$ due to the voltage on line 38 thereby isolating node B or line 40 from node E.

Figure 4:
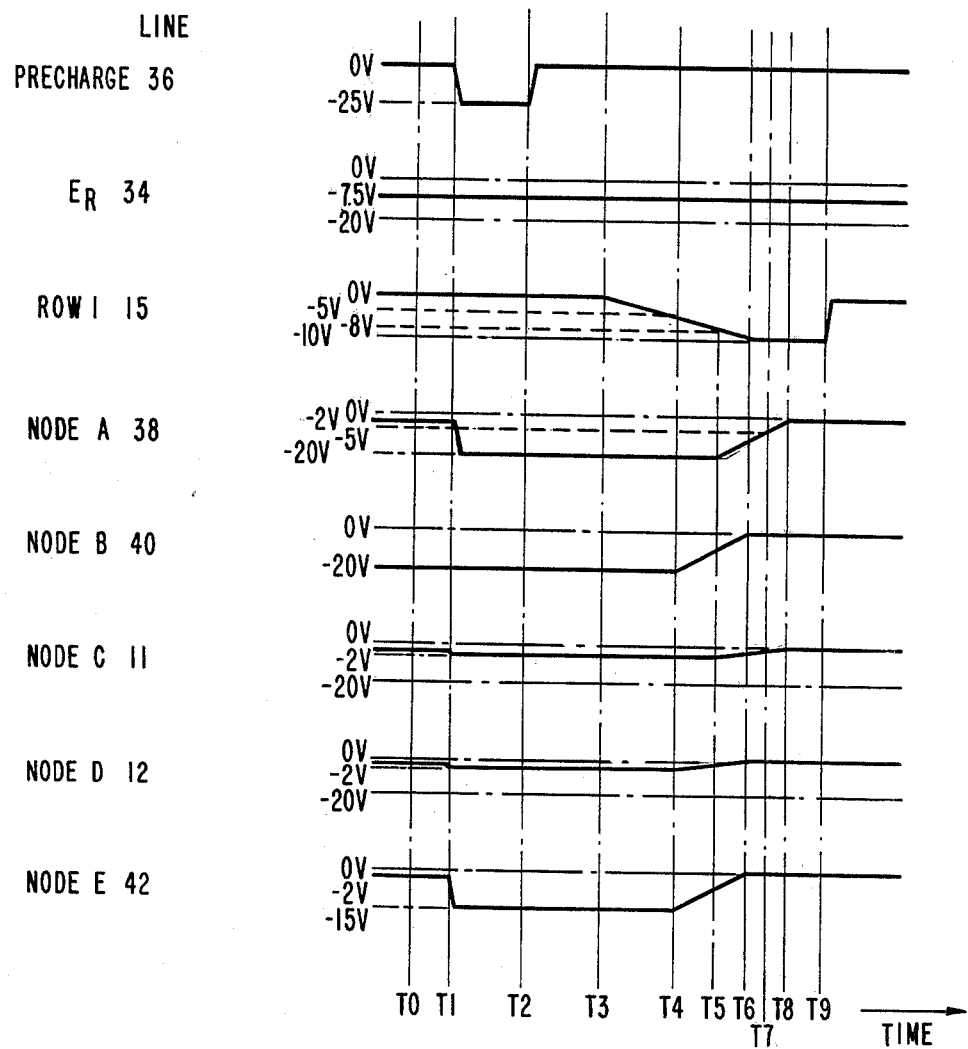

FIG. 4 shows additional circuit wave forms for the operation of the embodiment of the invention shown in FIG. 1. In FIG. 4 the ordinate represents voltage and the abscissa represents time. The wave forms in FIG. 4 are for the case where transistor 25 in memory array 14 has been written to a high state or a voltage threshold of −8 volts. As in FIG. 3 the threshold voltage of transistor 27 is at −5 volts. At time $T_0$ the voltage on line 36 is 0 volts. The voltage of voltage supply $E_R$ on line 34 is −7.5 volts. The voltage on row 1 and row 2 lines 15 and 16, respectively, are 0 volts. The voltage on node A, C, D and E are approximately −2 volts while the voltage on node B may be, for example, −20 volts. At time $T_1$ signal PRECHARGE on line 36 goes from 0 volts to −25 volts causing transistors 20 and 22 to conduct precharging nodes A and B to −20 volts. With node A at −20 volts transistor 23 is caused to conduct charging node E or line 42 to −15 volts. Nodes C and D are charged by the conduction of transistors 21 and 24 to a voltage of $E_R - V_T$ where $E_R$ is −7.5 volts and $E_R$ is −5 volts. Nodes C and D are charged to −2.5 volts.

At time $T_2$ signal PRECHARGE goes from −25 volts to 0 volts causing transistors 20 and 22 to be nonconducting. Nodes A through E are left in the floating condition. At time $T_3$ signal row 1 on line 15 goes from 0 volts towards −10 volts. At time $T_4$ transistor 27 begins to conduct causing node E to charge towards ground potential. Due to the conduction of transistors 23 and 24 nodes E and B begin to charge towards 0 volts. At time $T_5$ transistor 25 begins to conduct charging nodes C and A towards ground potential. At time $T_6$ nodes E and B have reached $(E_R - V_T) = 2.5$ v. At time $T_7$ node A has reached −5 volts and transistor 23 goes from the conducting state to the non-conducting state. However, at time $T_7$ node B has already been fully discharged to −2.5 v. When transistor 23 goes to the non-conducting state output, node B is isolated from node E. At time $T_8$ node C and node A reach ground potential.

At time $T_9$ signal row 1 on line 15 goes from −10 volts to 0 volts causing transistors 25 and 27 to be nonconducting. $T_9$ completes the READ cycle for sensing the threshold state of transistor 25 compared to transistor 27.

Control signal row 1 and line 15 charging time from 0 volts to −10 volts may be controlled by adjusting the RC time constant. The total capacitance on line 15 may be, for example, 2 to 3 picofarads and the output drive of the row decoder 18 may have an impedance of 10K ohms. The RC time constant would, therefore, be in the range of 20 to 30 nanoseconds.

The capacitance of node A may be equal to the capacitance of nodes B and E combined so that the voltage on node B will charge or discharge as fast as the voltage on node A for a given change in the voltage on nodes C or D, respectively. Node D has a large capacitance similar to node C because of the column of sense transistors, 1 per row, exhibits the same capacitance characteristics as a column of memory transistors. The capacitance of line 11, node C, therefore will approximate the capacitance of line 12, node D.

An alternate method of reading memory array 14 is to have control signal row 1 on line 15 go from 0 volts to −10 volts in as short a time as reasonably practicable. Memory sense circuit 10 would then compare the $G_M$ of transistors 25 and 27 by the current that flows through the respective transistor into nodes C and D. The $G_M$ of transistors 25 and 27 is related to the threshold voltage of the repsective transistor. In fact, transistor 27 may be a variable threshold transistor or a fixed threshold transistor having a predetermined $G_M$.

Another alternative would still utilize a control signal row 1 on line 15 which would go from 0 volts to −10 volts rapidly, that is faster than nodes C and D could follow and to cause a capacitance of node A to be greater than the capacitance of nodes B and E or vice versa. If the capacitance of nodes B and E is greater than the capacitance of node A, and if the threshold voltage of the sense transistor, 27, is at −2 volts, then if the threshold voltage of transistor 25 is also at −2 volts or in the low state, then node A would charge first and isolate node B before node B was discharged to ground. Node B would then be read out as −20 volts. If transistor 25 was in the high state, such as −8 volts then node D and B would be discharged first to ground before node A would be charged. Node B would then be at ground potential.

If transistor 27, the sense transistor, is a variable threshold transistor, then the variable threshold characteristics of transistor 27 may be kept close to those of transistor 25 by writing transistor 27 first to the high state such as −8 volts and then back to the low state such as −2 volts each time the memory row is filled with data. The sense transistor, transistor 27, will therefore have its threshold voltage cycled in a manner identical to that which the rest of the transistors in the memory array 14 see or experience. Thus, any changes in the memory state, threshold voltage, due to repeated cycling of the threshold voltage will be automatically adjusted for by the sense transistor, transistor 27.

The invention provides a memory sense circuit for comparing the threshold voltage of a first and second variable threshold transistor wherein the source electrode of the first and second variable threshold transistors are coupled to a first voltage supply and the gate electrodes are coupled to a first control signal comprising third through fifth field effect transistors each having a gate, source and drain electrode, the gate electrode of the third and fifth transistors coupled to a second power supply, the source electrode of the third transistor coupled to the drain electrode of the first variable threshold transistor, the source electrode of the fifth transistor coupled to the drain electrode of the second variable threshold transistor, the drain electrode of the third transistor coupled to the gate electrode of the fourth transistor, the drain electrode of the fifth transistor coupled to the source electrode of the fourth transistor, a second control signal, and first means coupled to and responsive to the second control signal for coupling the drain electrode of the third and fourth transistors to a return path of the first voltage supply to precharge selected circuit nodes.

I claim:

1. A memory sense circuit for comparing the threshold voltage of a first and second variable threshold transistor wherein the source electrode of said first and second variable threshold transistors are coupled to a first voltage supply terminal and the gate electrodes are coupled to a first control signal terminal comprising:

third, fourth and fifth field effect transistors each having a gate, source and drain electrode, the gate electrode of said third and fifth transistors coupled to a voltage source terminal, the source electrode of said third transistor coupled to the drain electrode of said first variable threshold transistor, the source electrode of said fifth transistor coupled to the drain electrode of said second variable threshold transistor, the drain electrode of said third transistor coupled to the gate electrode of said fourth transistor, the drain electrode of said fifth transistor coupled to the source electrode of said fourth transistor, means for applying a second control signal, and first means responsive to said second control signal for coupling the drain electrode of said third and fourth transistors to a return path of said first voltage supply terminal to precharge selected circuit nodes.

2. The memory sense circuit of claim 1 wherein said first means includes sixth and seventh transistors each having a gate, source and drain electrode, the drain electrode of said third transistor coupled to the source electrode of said sixth transistor, the drain electrode of said fourth transistor coupled to the source electrode of said seventh transistor, the drain electrode of said sixth and seventh transistors coupled to the return path of said first voltage supply terminal, and the gate electrode of said sixth and seventh transistors coupled to said second control signal applying means.

3. The memory sense circuit of claim 1 wherein the total capacitance associated with the source node of said third transistor is substantially 100 times larger than the capacitance associated with the drain node of said third transistor.

* * * * *